(12) United States Patent
Platow et al.

(10) Patent No.: US 8,912,976 B2
(45) Date of Patent: Dec. 16, 2014

(54) INTERNAL RF ANTENNA WITH DIELECTRIC INSULATION

(75) Inventors: Wilhelm P. Platow, Salem, MA (US); Craig R. Chaney, Lanesville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 80 days.

(21) Appl. No.: 13/612,406

(22) Filed: Sep. 12, 2012

(65) Prior Publication Data

US 2014/0070697 A1 Mar. 13, 2014

(51) Int. Cl.
 *H01Q 1/36* (2006.01)
(52) U.S. Cl.
 USPC ............................................. 343/895; 315/34
(58) Field of Classification Search
 CPC .................................................. H01J 37/32082
 USPC ..................................... 343/866, 895; 315/34
 See application file for complete search history.

(56) References Cited

U.S. PATENT DOCUMENTS

| | | |
|---|---|---|
| 4,725,449 A | 2/1988 | Ehlers et al. |
| 5,587,226 A | 12/1996 | Leung et al. |
| 6,376,978 B1 | 4/2002 | Leung et al. |
| 2003/0095072 A1 | 5/2003 | Kwon et al. |
| 2005/0199121 A1* | 9/2005 | Crnko et al. ..................... 95/87 |
| 2008/0097193 A1* | 4/2008 | Karmarkar ..................... 600/423 |
| 2009/0261846 A1* | 10/2009 | Wissmath et al. ............ 324/663 |
| 2011/0080094 A1 | 4/2011 | Setsuhara et al. |

FOREIGN PATENT DOCUMENTS

WO 01-67830 A1 9/2001

OTHER PUBLICATIONS

International Search Report and Written Opinion, mailed Nov. 22, 2013 for PCT/US2013/058872 filed Sep. 10, 2013.

* cited by examiner

*Primary Examiner* — Tan Ho

(57) ABSTRACT

Disclosed is a radio frequency (RF) antenna for plasma ion sources. The RF antenna includes a low-resistance metal tube having an inner and outer diameter. A low friction polymer tube also having an inner and outer diameter surrounds the low-resistance metal tube. The inner diameter of the polymer tube is slightly larger than the outer diameter of the low-resistance metal tube. A pre-formed quartz glass tube encases the low friction polymer tube and low-resistance metal tube. The quartz glass tube is pre-formed in a desired shape. A guide wire is attached inside one end of the low-resistance hollow metal tube. The flexible low friction polymer tube containing the low-resistance metal tubed may then be threaded through the quartz glass tube.

18 Claims, 4 Drawing Sheets

INTERNAL RF ANTENNA WITH DIELECTRIC INSULATION

BACKGROUND OF THE INVENTION

1. Field of the Invention

Embodiments of the invention relate to internal RF antennas for use with ion plasma sources. More particularly, the present invention relates to internal RF antennas for use with ion plasma sources that include a dielectric insulation component.

2. Discussion of Related Art

Plasmas are used in a variety of ways in semiconductor processing to implant wafers or substrates with various dopants, to deposit or to etch thin films. Such processes involve the directional deposition or doping of ions on or beneath the surface of a target substrate. Generally, plasmas are generated by supplying energy to a neutral gas introduced into a chamber to form charged carriers which are implanted into or deposited on the target substrate. The gas is ionized by any of several methods of plasma generation including, but not limited to DC glow discharge, capacitively coupled RF, inductively coupled RF, etc.

An RF source may have an antenna positioned external a dielectric window of an ion source chamber or have an antenna positioned inside the ion source chamber. In an RF source having an internal antenna, an induction coil or RF antenna is internally disposed in the ion source chamber and supplies energy to ionize gas introduced into the chamber. The RF antenna within the chamber usually takes the shape of a coil which includes power leads that extend through seals in the walls of the chamber. Since these RF antennas are exposed to the generated plasma within the ion source chamber, the antenna is usually protected by a dielectric coating such as glass, porcelain, alumina, etc. However, coated RF antenna coils generally have limited lifetimes because the coatings typically contain micro-pores or hair fractures that lead to punctures in the dielectric coating material when exposed to caustic RF plasma material. Alternatively, a glass tube may be used to insulate the antenna. These tubes have a shape corresponding to the conductive material being encased through a process of heating and bending. Since glass has a high melting point, the conductive metal must also have a high melting point to make the materials malleable enough to bend into the desired shape. Two often used metals are stainless steel and titanium. Stainless steel has a resistivity of approximately $69\text{-}75\times10^{-8}$ $\Omega$-m while titanium has a resistivity of approximately $42\times10^{-8}$ $\Omega$-m. Conductors with high resistivity lead to a large Q factor which generally refers to the quality factor of the transmitter coil. Conductors such as copper ($1.7\times10^{-8}$ $\Omega$-m), aluminum ($2.65\times10^{-8}$ $\Omega$-m), and silver ($1.65\times10^{-8}$ $\Omega$-m) have lower resistivity as compared to stainless steel and titanium. Thus, the Q factor for titanium and stainless steel having high resistivity stainless steel and titanium is approximately 25-45 times lower as compared to a material such as copper which has a relatively lower resistivity metal such as copper. A material that has a high Q (e.g. stainless steel, titanium) antenna will be much less efficient and will suffer inductive losses as compared to a lower Q (copper, aluminum, silver) antenna. In addition, if the melting points of the glass and the metal conductor are too dissimilar, one may liquefy or become too malleable with respect to the other. The problem with high melting point metals is that they have higher electrical resistance properties which lead to an inefficient high Q for an RF antenna.

Some RF antennas may employ a conductive metal such as copper, but must then use a lower grade glass having a much lower melting point than quartz to maintain an acceptable range for the melting points of both materials. The use of a lower grade glass, however, introduces other unwanted characteristics such as sputtering that can lead to contamination issues and electrical shorting of the antenna to walls of the chamber. Extensive sputtering may eventually puncture the antenna casing (lower grade glass) which may lead to water leaks and flooding of the vacuum chamber of the ion source. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Various embodiments are generally directed to internal RF antennas having dielectric insulation components. In one embodiment there is disclosed an RF antenna for plasma ion sources comprising a low-resistance metal tube having an inner and outer diameter, a low friction polymer tube having an inner and outer diameter surrounding the low-resistance metal tube, the inner diameter of the polymer tube being slightly larger than the outer diameter of the low-resistance metal tube, and a pre-formed quartz glass tube containing the low friction polymer tube and low-resistance metal tube.

In another embodiment there is disclosed an ion source having an RF antenna. The RF antenna comprises a low-resistance metal tube having an inner and outer diameter, a low friction polymer tube having an inner and outer diameter surrounding the low-resistance metal tube, the inner diameter of the polymer tube being slightly larger than the outer diameter of the low-resistance metal tube, and a pre-formed quartz glass tube containing the low friction polymer tube and low-resistance metal tube. The ion source also includes a coolant reservoir coupled with each end and a power source coupled with the low-resistance metal tube. The coolant reservoir stores a coolant (e.g., water) that circulates through the low-resistance metal tube. The power source drives the RF antenna.

In another embodiment, a method of forming an RF antenna for an ion source, the RF antenna having a dielectric insulation component is described. A low-resistance hollow metal tube is inserted into a flexible low friction polymer tube, the inner diameter of the polymer tube being slightly larger than the outer diameter of the low-resistance metal tube. A guide wire is attached inside one end of the low-resistance hollow metal tube. The flexible low friction polymer tube containing the low-resistance metal tube is threaded through the pre-formed quartz glass tube. A liquid lubricant may be applied within the pre-formed quartz glass tube before threading the polymer tube containing the low-resistance metal tube through the pre-formed quartz glass tube using, for instance, a push/pull technique of guiding the low-resistance metal tube through the pre-formed quartz glass tube. Once the low-resistance metal tube is completely threaded, the polymer tube may be slid out of the pre-formed quartz glass tube leaving the low-resistance metal tube within the pre-formed quartz glass tube.

DESCRIPTION OF EMBODIMENTS

Figure 1:
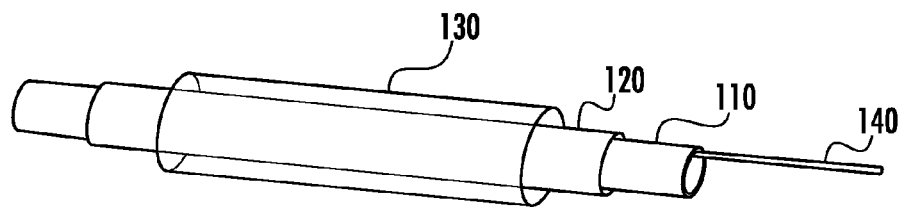
FIG. 1 illustrates RF antenna system components according to an embodiment of the present disclosure.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

An ion source is a plasma generator from which an ion beam may be extracted for various purposes. It is desirable for ion sources to have an internal RF antenna because it enables the application of multi-cusp magnets in the ion source. The multi-cusp magnets help confine the source plasma and enhance the plasma density leading to larger extraction currents and increased throughput. In order to operate the RF antenna at sufficiently high power, the antenna needs to be cooled and insulated from the plasma by a dielectric material. Typical dielectric materials include quartz glass or alumina. Cooling prevents the RF antenna from deforming or even melting. Cooling may be achieved by forming the antenna from a tube of low-resistance metal (e.g., copper) and passing water through the tube during operation of the RF antenna. The insulation of the RF antenna with a dielectric prevents sputtering of the RF antenna which may cause several problems. For example, one problem may be the deposition of the sputtered metal over the interior chamber walls and feed-throughs of the ion source. This, in turn, may lead to contamination issues and shorting of the RF antenna to the walls of the ion source chamber. A more serious problem may be that extensive sputtering may eventually puncture the antenna leading to water leaks and flooding of the ion source vacuum chamber.

Quartz glass is an ideal insulating material because its dielectric properties and sputter coefficient are favorable for RF applications and it can be bent into complex shapes by standard glass blowing techniques. However, it is not a trivial task to achieve complex shapes such as a helix with a quartz glass tube containing a low-resistance metal tube within its interior.

Various embodiments are directed to an insulated RF antenna suitable for use within an ion source chamber. Ideally, the antenna element would be comprised of a low-resistance metal such as, but not limited to, copper, aluminum, or silver. The insulating material would exhibit superlative dielectric properties and be able to withstand high temperatures. One such insulating material is quartz. Encasing a low-resistance metal tube with a quartz glass is not achievable using the prior art methods. The melting points between the two materials are too large. The low-resistance metal tube would liquefy at the temperatures need to bend the quartz tubing. Conversely, the quartz glass would not be malleable enough to bend at the temperatures needed to bend the low-resistance metal. Thus, the heating and bending methods do not work.

The embodiments herein employ a pre-formed quartz glass tube. That is, the quartz glass is heated and formed independent of the low-resistance metal tubing used as the conductive element for the antenna. Once the quartz glass is formed into the desired antenna configuration, the low-resistance metal tube is threaded within. A low friction polymer tube is used to encase the low-resistance metal tube. The low friction polymer tube acts as a solid lubricant. Teflon™ and perfluoroalkoxy (PFA) are two suitable polymer materials. In addition, the quartz glass tube may be coated inside with a liquid lubricant such as water or alcohol. The polymer encased low-resistance metal tube may be gently forced into and through the quartz glass tubing using a guide wire that has been attached to an end of the low-resistance metal tube. The polymer tube also protects the quartz glass from damage from any sharp edges of the low-resistance metal tube. Once inserted into the quartz glass tube, the polymer tube encasing the low-resistance metal tube may be removed by sliding it out. Alternatively, the polymer tube may be left in place since it has a sufficiently high melting point and is cooled by water flowing through the low-resistance metal tube.

Other embodiments address methods of making an RF antenna or coil that is made of a low resistive metal such as copper, aluminum or silver, can have a complex shape such as a helix, is insulated by a high melting point dielectric such as quartz glass and is water cooled by flowing water through the RF antenna coil itself. The embodiments described herein enable the easy fabrication of an internal RF antenna for an ion source. In particular, the embodiments enable fabrication of an RF antenna with complex shapes and a combination of the most desirable materials for RF applications such as, but not limited to, quartz glass and copper. An internal RF antenna also permits the use of multi-cusp magnets leading to increased plasma density, beam currents and throughput for the ion source.

FIG. 1 illustrates a perspective view of RF antenna system components 100 according to an embodiment of the present disclosure. In particular, a low-resistance metal tube 110 is surrounded by a flexible low-friction polymer tube 120 which, in turn, is encased by quartz glass tubing 130. Also shown is a guide wire 140 that is used to thread the flexible low-friction polymer tube 120 wrapped around the low-resistance metal tube 110 through the quartz glass tubing 130. The guide wire 140 may be attached to a leading or trailing end of the low-resistance metal tube 110, for example, by crimping, soldering or other mechanical means. Once attached, the guide wire 140 will permit pulling and guiding the low-resistance metal tube 110 through the quartz glass tubing 130. The flexible low-friction polymer tube 120 acts as a solid lubricant to facilitate the threading process. The pulling on the guide wire 140 along with a gentle pushing on the other end of the low-resistance metal tube 110 combine to thread the low-resistance metal tube 110 through the pre-formed quartz glass tube 130.

The flexible low-friction polymer tube 120 may be comprised of Teflon™ which has a coefficient of friction of 0.0800-0.3 and perfluoroalkoxy (PFA) which has a coefficient of friction of 0.0400-0.060, for example which defines its low-friction property. These polymers possess sufficiently high melting points and are sufficiently friction resistant to enable the flexible low-friction polymer tube 120 to slide inside the pre-formed quartz glass tube 130 without damaging the inside of the pre-formed quartz glass tube 130 and/or preventing the low-resistance metal tube 110 from kinking as it traverses the inside of the pre-formed quartz glass tube 130. Quartz glass is chosen for its superior dielectric properties. The low-resistance metal tube 110 may be comprised of copper, aluminum or silver based on their low resistance properties. For example, tube 110 may be made from, for example, copper having a resistivity of $1.7 \times 10^{-8}$ Ω·m, aluminum having a resistivity of $2.65 \times 10^{-8}$ Ω-m, silver having a resistivity of $1.65 \times 10^{-8}$ Ω-m, etc., and as compared to other materials such as stainless steel and titanium are considered low-resistance materials. These metals also have a lower melting point meaning they are more malleable at lower temperatures than many other metals such as stainless steel or titanium.

Figure 2:
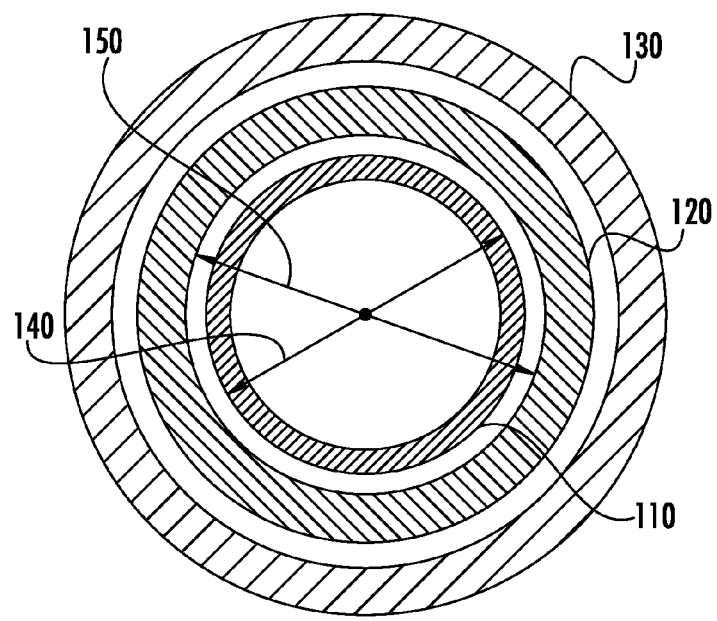
FIG. 2 illustrates a cross-sectional view of the RF antenna system components according to an embodiment of the present disclosure.

FIG. 2 illustrates a cross-sectional view 200 of the RF antenna system components according to an embodiment of the present disclosure. In this illustration, the inner most ring is the low-resistance metal tube 110. The arrow 140 represents the outer diameter of the low-resistance metal tube 110. The next ring is the flexible low-friction polymer tube 120. The arrow 150 represents the inner diameter of the flexible low-friction polymer tube 120. The inner diameter of the flexible low-friction polymer tube 120 must be larger than the outer diameter of the low-resistance metal tube 110 in order for the low-resistance metal tube 110 to fit inside the flexible low-friction polymer tube 120. The outer most ring represents the pre-formed quartz glass tube 130.

Figure 3:
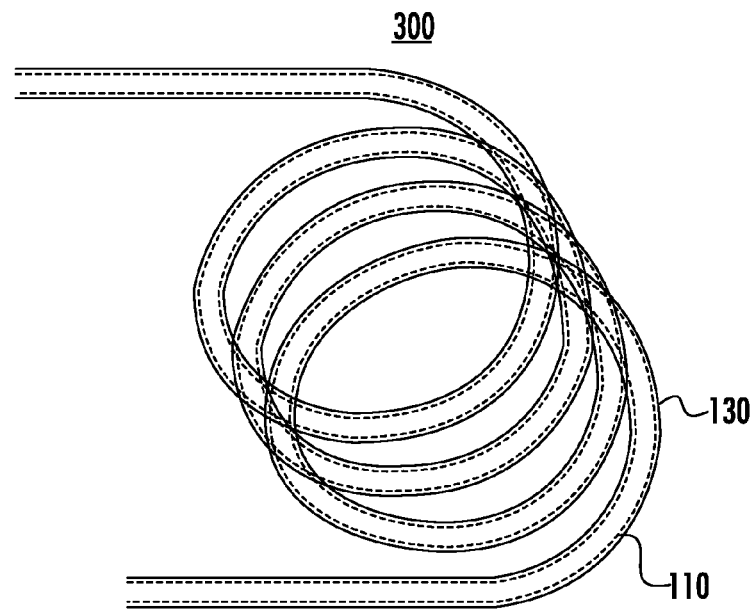
FIG. 3 illustrates an RF antenna system according to another embodiment of the present disclosure.

FIG. 3 illustrates an RF antenna system 300 according to another embodiment of the present disclosure. In this embodiment, the quartz glass tube 130 has been pre-formed into a coil or helix shape. This shape may have been chosen based on the inductive properties it exhibits when a current is flowing through a conductor housed therein. The dashed line represents the low-resistance metal tube 110 that has been threaded into the quartz glass tube 130. The flexible low-friction polymer tube 120 was used to thread the low-resistance metal tube 110 into the pre-formed quartz glass tube 130 but has since been removed prior to putting the antenna system 300 into use.

Figure 4:
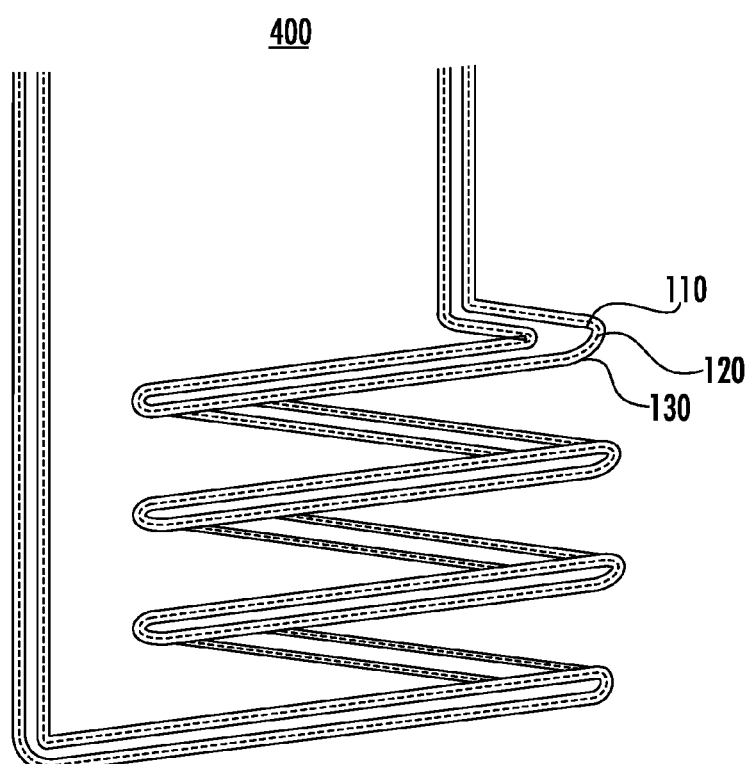
FIG. 4 illustrates an RF antenna system according to another embodiment of the present disclosure.

FIG. 4 illustrates an RF antenna system 400 according to another embodiment of the present disclosure. In this embodiment, the quartz glass tube 130 has been pre-formed into a coil or helix shape. This shape may have been chosen based on the inductive properties it exhibits when a current is flowing through a conductor housed therein. The dashed line represents the flexible low-friction polymer tube 120 used to thread the low-resistance metal tube 110 into the pre-formed quartz glass tube 130. The inner most solid line represents the low-resistance metal tube 110. In this embodiment, the flexible low-friction polymer tube 120 has not been removed. This is acceptable because the flexible low-friction polymer tube 120 has a sufficiently high melting point to avoid breaking down especially in light of a coolant that can be made to circulate through the low-resistance metal tube 110.

Included herein is one or more flow charts representative of exemplary methodologies for performing novel aspects of the disclosed structure. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. Moreover, not all acts illustrated in a methodology may be required for a novel implementation.

Figure 5:
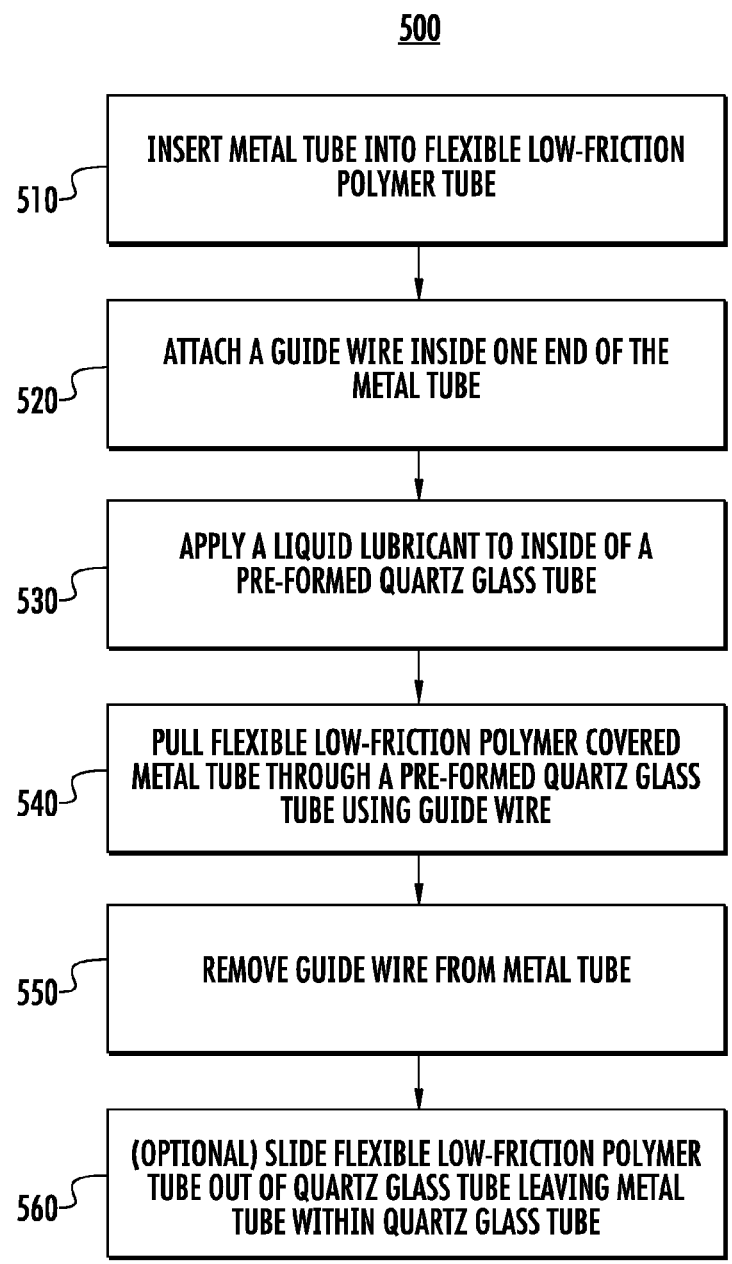
FIG. 5 illustrates a logic flow diagram according to an embodiment of the present disclosure.

FIG. 5 illustrates a logic flow 500 diagram according to an embodiment of the invention. The logic flow 500 may insert a low-resistance metal tube 110 into a flexible low-friction polymer tube 120 at block 510. For example, the low-resistance metal tube 110 may be sized so that it snugly but easily fits within the low-friction polymer tube 120. The low-friction polymer tube 120 may be comprised of Teflon™ or PFA. The embodiments are not limited to this example.

The logic flow 500 may attach a guide wire 140 inside one end of the low-resistance metal tube 110 at block 520. For example, the guide wire 140 may be attached to a leading or trailing end of the low-resistance metal tube 110, for example, by crimping, soldering or other mechanical means. Once attached, the guide wire 140 will permit pulling and guiding the low-resistance metal tube 110 through the pre-formed quartz glass tube 130. The embodiments are not limited to this example.

The logic flow 500 may apply a liquid lubricant to inside of a pre-formed quartz glass tube at block 530. For example, a liquid such as water or alcohol may be applied to the inside of the pre-formed quartz glass tube 130 to provide additional lubricant while threading the low-friction polymer tube 120 containing the low-resistance metal tube 110 through the pre-formed quartz glass tube 130. The pre-formed quartz glass tube 130 may be pre-formed into a desired shape to maximize the inductive properties of the RF antenna system. One such shape is a helix or coil. The embodiments are not limited to this example.

The logic flow 500 may pull the flexible low-friction polymer covered low-resistance metal tube 110 through the pre-formed quartz glass tube 130 using guide wire 140 at block 540. For example, the low-friction polymer tube 120 acts as a solid lubricant encasing the low-resistance metal tube 110. The guide wire 140 that is attached to the low-resistance metal tube 110 may be initially threaded through the pre-formed quartz glass tube 130. A gentle but consistent force may then be applied to one end of the low-resistance metal tube 110 while simultaneously pulling on the guide wire 140 to thread the low-resistance metal tube 110 through the pre-formed quartz glass tube 130. The curves of the pre-formed quartz glass tube 130 are designed such that the low-resistance metal tube 110 will conform to the shape of the pre-formed quartz glass tube 130 but will not kink as it is being threaded. The embodiments are not limited to this example.

Preventing kinks in the low-resistance metal tube 110 is significant because kinks may obstruct the circulation of a coolant and create hot spots or could cause the low-resistance metal tube 110 to tear the low-friction polymer tube 120 and potentially scratch or damage the pre-formed quartz glass tube 130.

The logic flow 500 may remove the guide wire from the low-resistance metal tube 110 at block 550. Once the low-resistance metal tube 110 has been successfully threaded into the pre-formed quartz glass tube 130, it is removed before placing the RF antenna system into operation. The embodiments are not limited to this example.

The logic flow 500 may optionally slide the flexible low-friction polymer tube 120 out of the pre-formed quartz glass tube 130 leaving the low-resistance metal tube 110 within pre-formed quartz glass tube 130 at block 560. The flexible low-friction polymer tube 120 may remain without adversely affecting the performance of the RF antenna system. The flexible low-friction polymer tube 120 has a high enough melting point to maintain its integrity during operation of the RF antenna especially with the coolant circulating through the low-resistance metal tube 110. In addition, retaining the flexible low-friction polymer tube 120 also helps keep the low-resistance metal tube 110 in a good position within the pre-formed quartz glass tube 130. The embodiments are not limited to this example.

The embodiments described herein provide for a high dielectric insulator (e.g., quartz glass) to be used with a low-resistance metal conductor (e.g., copper) in a custom shaped RF antenna design. This is because heating the insulator to form it while the conductor is inside is not necessary. The insulator is pre-formed using whatever process appropriate. The insulator may then be cooled. A low-resistance conductor has a significantly lower melting point making the conductor malleable without significant heat applied. The use of a solid lubricant flexible polymer tube between the insulator and the conductor further assists in threading the conductor into the insulator.

This is in contrast to previous methods that required inserting a straight conductor into a straight insulator. Once inside, the combination of conductor and insulator was heated to a requisite temperature and molded, bent, or formed around a frame to achieve the desired RF antenna shape. This method has drawbacks in that good dielectric insulators like quartz have high melting points while good (e.g., low resistance) conductors have significantly lower melting points. This disparity prevents them from using the previous methods because the conductors cannot withstand the heat needed to mold the insulator.

Figure 6:
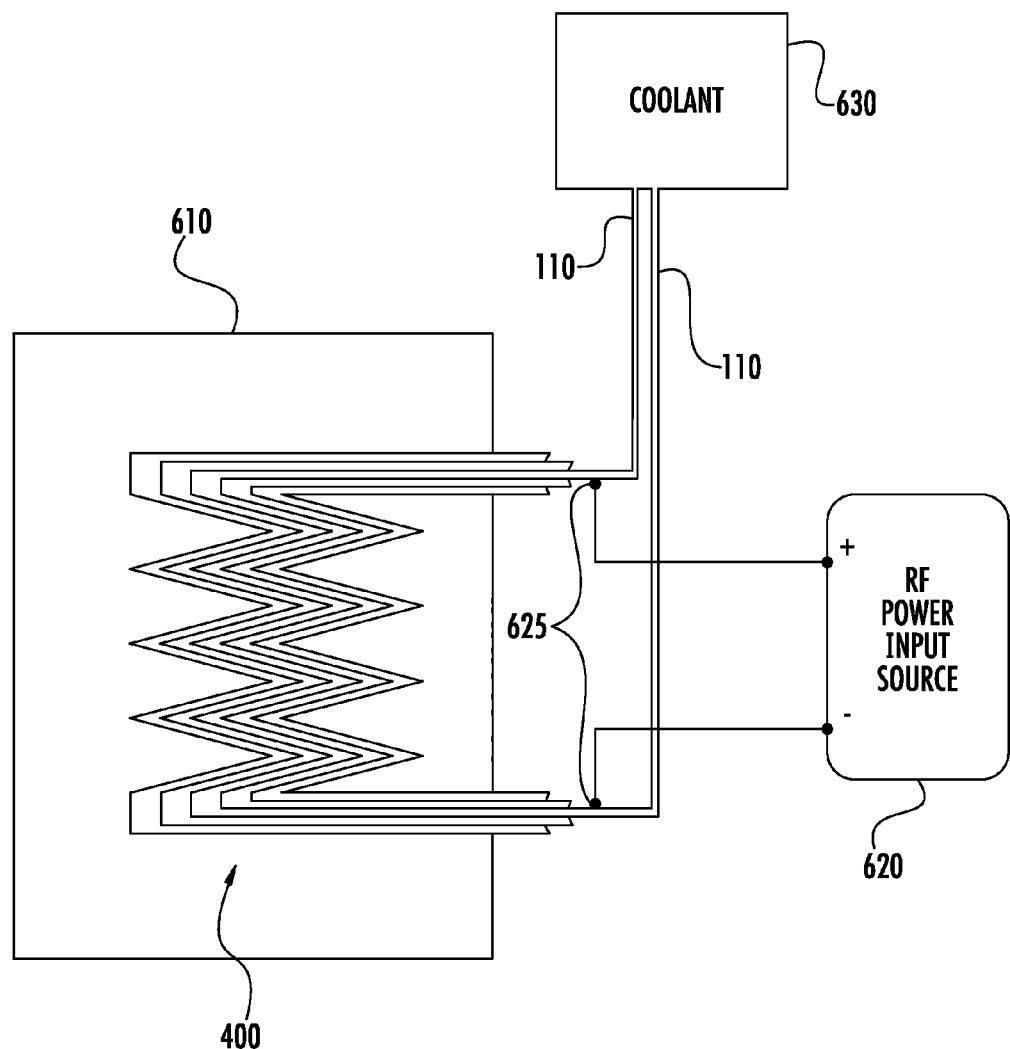
FIG. 6 illustrates an RF antenna system used with an ion source according to another embodiment of the present disclosure.

FIG. 6 illustrates an RF antenna system 400 used with an ion source 610 according to another embodiment of the present disclosure. An ion source 610 is a plasma generator from which beams of ions may be extracted. Plasma may be generated in an ion source by DC discharge or RF induction discharge. The embodiments herein are directed toward using an RF antenna to facilitate RF induction discharge. A complete description of an ion source 610 has not been provided herein because the focus of the embodiments is on the coiled antenna system 400. The coiled antenna system 400 is contained in the vacuum sealed ion source 610. Each end of the coiled antenna system 400 protrudes out of the ion source 610. The inner-most ring of the antenna system 400 is the low-resistance metal tubing 110. Each end of the low-resistance metal tubing 110 is coupled with a coolant reservoir 630 to form a closed circulation path. The coolant reservoir 630 stores a coolant (e.g., water) that flows through the low-resistance metal tubing 110 to cool the entire antenna system including the polymer tubing 120 and the pre-formed quartz glass tubing 130. A pair of conductive electrodes 625 couple an RF power input source 620 to the low-resistance metal tubing 110 to provide the requisite electricity to enable the inductive properties of the coiled antenna system 400.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A radio frequency (RF) antenna comprising:
    a low-resistance metal tube having an inner and outer diameter;
    a low friction polymer tube having an inner and outer diameter surrounding the low-resistance metal tube, the inner diameter of the polymer tube being larger than the outer diameter of the low-resistance metal tube; and
    a pre-formed quartz glass tube containing the low friction polymer tube and low-resistance metal tube.

2. The radio frequency (RF) antenna of claim 1, wherein the pre-formed quartz glass tube has a first bend radius and the low-resistance metal tube has a second bend radius, the first bend radius being substantially equal to the second bend radius.

3. The radio frequency (RF) antenna of claim 1, wherein the low friction polymer tube comprises perfluoroalkoxy (PFA).

4. The radio frequency (RF) antenna of claim 1, wherein the pre-formed quartz glass tube has a coil shape corresponding to a shape of the low resistance metal tube.

5. The radio frequency (RF) antenna of claim 1, further comprising a coolant circulating through the low-resistance metal tube.

6. A method of forming a radio frequency (RF) antenna comprising:
    inserting a low-resistance hollow metal tube into a flexible low friction polymer tube, the inner diameter of the polymer tube being slightly larger than the outer diameter of the low-resistance metal tube;
    attaching a guide wire inside one end of the low-resistance hollow metal tube; and threading the flexible low friction polymer tube containing the low-resistance metal tube through a pre-formed quartz glass tube.

7. The method of claim 6 further comprising applying a liquid lubricant within the pre-formed quartz glass tube before threading the polymer tube containing the low-resistance metal tube through the quartz glass tube.

8. The method of claim 6 further comprising sliding the polymer tube out of the pre-formed quartz glass tube leaving the low-resistance metal tube within the quartz glass tube.

9. The method of claim 6, wherein the pre-formed quartz glass tube has a first bend radius and the low-resistance metal tube has a second bend radius, the first bend radius being substantially the same as the second bend radius.

10. The method of claim 6, wherein the low friction polymer tube comprising perfluoroalkoxy (PFA).

11. The method of claim 6, wherein the pre-formed quartz glass tube being coil shaped causing the low-resistance metal tube to conform to the same shape once threaded.

12. The method of claim 6, wherein further comprising circulating a coolant through the low-resistance metal tube.

13. The method of claim 6, wherein further comprising removing the guide wire.

14. An ion source comprising:
    an ion source chamber;
    a radio frequency (RF) antenna disposed within the ion source chamber, the RF antenna comprising:
        a low-resistance metal tube having an inner and outer diameter and a first and second end;
        a low friction polymer tube having an inner and outer diameter surrounding the low-resistance metal tube, the inner diameter of the polymer tube being slightly larger than the outer diameter of the low-resistance metal tube; and
        a pre-formed quartz glass tube housing the low friction polymer tube and low-resistance metal tube;
    a coolant reservoir outside the ion source chamber coupled with each of the first and second ends of the low-resistance metal tube to create a closed circulation path; and
    a power source outside the ion source chamber coupled with the low-resistance metal tube.

15. The ion source of claim 14, wherein the pre-formed quartz glass tube having a first bend radius and the low-resistance metal tube having a second bend radius, the first bend radius being substantially the same as the second bend radius.

16. The ion source of claim 14, wherein the low friction polymer tube comprising perfluoroalkoxy (PFA).

17. The ion source of claim 14, wherein the pre-formed quartz glass tube being coil shaped causing the low-resistance metal tube to conform to the same shape once threaded.

18. The ion source of claim 14, wherein further comprising a coolant circulating through the low-resistance metal tube.

* * * * *